(12) United States Patent
Jang et al.

(10) Patent No.: US 6,869,858 B2
(45) Date of Patent: *Mar. 22, 2005

(54) SHALLOW TRENCH ISOLATION PLANARIZED BY WET ETCHBACK AND CHEMICAL MECHANICAL POLISHING

(75) Inventors: Syun-Ming Jang, Hsin-Chu (TW); Ying-Ho Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 20 days.

This patent is subject to a terminal disclaimer.

(21) Appl. No.: 10/426,529

(22) Filed: Apr. 30, 2003

(65) Prior Publication Data

US 2003/0194848 A1 Oct. 16, 2003

Related U.S. Application Data

(63) Continuation of application No. 09/236,489, filed on Jan. 25, 1999, now abandoned.

(51) Int. Cl.[7] .............................................. H01L 21/76
(52) U.S. Cl. ...................................... 438/427; 438/692
(58) Field of Search ................................ 438/424, 427, 438/435, 437

(56) References Cited

U.S. PATENT DOCUMENTS

| | | | | |
|---|---|---|---|---|
| 4,954,459 A | * | 9/1990 | Avanzino et al. ............ | 438/437 |
| 5,492,858 A | * | 2/1996 | Bose et al. .................. | 438/437 |
| 5,494,857 A | * | 2/1996 | Cooperman et al. ......... | 438/437 |
| 5,498,565 A | * | 3/1996 | Gocho et al. ................ | 438/427 |
| 5,702,977 A | * | 12/1997 | Jang et al. ................... | 438/427 |
| 5,981,355 A | * | 11/1999 | Lee .............................. | 438/424 |
| 6,004,863 A | * | 12/1999 | Jang ............................. | 438/424 |
| 6,030,881 A | * | 2/2000 | Papasouliotis et al. ....... | 438/424 |
| 6,037,018 A | * | 3/2000 | Jang et al. ................... | 438/424 |
| 6,048,775 A | * | 4/2000 | Yao et al. .................... | 438/427 |
| 6,057,210 A | * | 5/2000 | Yang et al. .................. | 438/427 |
| 6,211,040 B1 | * | 4/2001 | Liu et al. ..................... | 438/424 |

* cited by examiner

Primary Examiner—Anh Duy Mai
(74) Attorney, Agent, or Firm—Haynes and Boone, LLP

(57) ABSTRACT

A method for forming a series of patterned planarized aperture fill layers within a series of apertures within a topographic substrate layer employed within a microelectronics fabrication. There is first provided a topographic substrate layer employed within a microelectronics fabrication, where the topographic substrate layer comprises a series of mesas of substantially equivalent height but of differing widths and the series of mesas is separated by a series of apertures. There is then formed upon the topographic substrate layer a blanket aperture fill layer. The blanket aperture fill layer is formed employing a simultaneous deposition and sputter method. The blanket aperture fill layer fills the series of apertures to a planarizing thickness at least as high as the height of the mesas while simultaneously forming a series of protrusions of the blanket aperture fill layer corresponding with the tops of the series of mesas, where the thickness of a protrusion of the blanket aperture fill layer over a narrow mesa is less than the thickness of a protrusion of the blanket aperture fill layer over a wide mesa. The simultaneous deposition and sputter method employs a deposition rate:sputter rate ratio which provides sufficient thickness of the blanket aperture fill layer over the narrow mesa to insure coverage of the edges of the mesas. A blanket etching process is employed to remove a portion of the blanket aperture fill layer so that chemical mechanical polish (CMP) planarizing of the residual blanket aperture fill layer forms the series of patterned planarized aperture fill layers within the series of apertures.

14 Claims, 4 Drawing Sheets

SHALLOW TRENCH ISOLATION PLANARIZED BY WET ETCHBACK AND CHEMICAL MECHANICAL POLISHING

This is a continuation of patent application Ser. No. 09/236,489, filing date Jan. 25, 1999 now abandoned, Shallow Trench Isolation Planarized By Wet Etchback And Chemical Mechanical Polishing, assigned to the same assignee as the present invention.

BACKGROUND OF THE INVENTION

1. Field of the Invention

The present invention relates generally to methods for forming aperture fill layers within apertures within topographic substrate layers employed within microelectronics fabrications. More particularly, he present invention relates to methods for forming patterned planarized aperture fill layers within apertures within topographic substrate layers employed within microelectronics fabrications.

2. Description of the Related Art

Semiconductor integrated circuit microelectronics fabrications are formed from semiconductor substrates within and upon whose surfaces are formed semiconductor integrated circuit devices. The semiconductor integrated circuit devices are connected internally and externally to the semiconductor substrates upon which they are formed through the use of patterned conductor layers which are separated by dielectric layers.

As semiconductor integrated circuit microelectronics fabrication integration levels have increased and semiconductor integrated circuit device and patterned conductor layer dimensions have decrease, it has become more prevalent in the art of semiconductor integrated circuit microelectronics fabrication to employ isolation methods, such as but not limited to hallow trench isolation (STI) and recessed oxide isolation (ROI) methods to form patterned planarized trench isolation regions within isolation trenches within semiconductor substrates in order to separate active regions of the semiconductor substrates within and upon which are formed semiconductor integrated circuit devices.

Such shallow trench isolation (STI) methods and recessed oxide isolation (ROI) methods are desirable for forming patterned planarized trench isolation regions within isolation trenches within semiconductor substrates employed within semiconductor integrated circuit microelectronics fabrication since shallow trench isolation (STI) methods and recessed oxide isolation (ROI) methods typically provide patterned planarized trench isolation regions which are nominally co-planar with the surfaces of adjoining active regions of a semiconductor substrate which they separate. Such nominally planar patterned planarized trench isolation regions and adjoining active regions of a semiconductor substrate generally optimize utility of limited depth of focus typically achievable with an advanced photoexposure apparatus employed when forming advanced semiconductor integrated circuit devices and patterned conductor layers within an advanced semiconductor integrated circuit microelectronics fabrication.

Of the methods which may be employed to form patterned planarized shallow trench isolation (STI) regions within semiconductor substrates employed within semiconductor integrated circuit microelectronics fabrications, high density, plasma chemical vapor deposition (HDP-CVD) methods employed in conjunction with chemical mechanical polish (CMP) methods have recently received considerable attention. High density plasma chemical vapor deposition (HDP-CVD) methods are typically characterized as, and alternately known as, simultaneous chemical vapor deposition (CVD) and insert gas ion sputtering (typically argon ion sputtering) methods, where a ratio between a deposition rate within the chemical vapor deposition (CVD) method and removal rate within the inert gas ion sputtering method is controlled to bring about the net resultant rate of layer deposition often with specific desired layer properties.

While high density plasma chemical vapor deposition (HDP-CVD) methods undertaken in conjunction with chemical mechanical polishing (CMP) planarizing methods are thus desirable within the art of semiconductor integrated circuit microelectronics fabrication for forming patterned planarized trench isolation regions within isolation trenches within semiconductor substrates employed within advanced semiconductor integrated circuit microelectronics fabrications, patterned planarized trench isolation regions are often not formed entirely without problems within semiconductor integrated circuit microelectronics fabrications while employing high density plasma chemical vapor deposition (HDP-CVD) methods in conjunction with chemical mechanical polish (CMP) methods. In particular, it is often difficult to form, with optimal uniformity and planarity, a series of patterned planarized trench isolation regions within a series of isolation trenches separated by a series of mesas of varying width but substantially equivalent height within a semiconductor substrate while employing a high density plasma chemical vapor deposition (HDP-CVD) method in conjunction with a chemical mechanical polish (CMP) planarizing method as is conventional in the art of semiconductor integrated circuit microelectronics fabrication.

It is thus towards the goal of forming within a semiconductor integrated circuit microelectronics fabrication with optimal uniformity and planarity a series of patterned planarized trench isolation regions within a series of isolation trenches separated by a series of mesas of varying width but substantially equivalent height while employing a high density plasma chemical vapor deposition (HDP-CVD) method in conjunction with chemical mechanical polish (CMP) planarizing method that the present invention is more specifically directed in a more general sense, the present invention is also directed towards providing a method for forming within a microelectronics fabrication which need not necessarily be a semiconductor integrated circuit microelectronics fabrication, with optimal planarity and uniformity, a series of patterned planarized aperture fill layer within a series of apertures separated by a series of mesas of varying width, while employing a high density plasma chemical vapor deposition (HDP-CVD) method in conjunction with a chemical mechanical polish (CMP) planarizing method.

Various methods have been disclosed in the art of microelectronics fabrication for forming planarized aperture fill layers within apertures within topographic substrate layers employed within microelectronics fabrications.

For example, Avanzino et al., in U.S. Pat. No. 4,954,459, discloses a polishing planarizing method for forming a planarized aperture fill dielectric layer within an aperture, such as but not limited to an isolation trench, within a topographic substrate layer, such as but not limited to a semiconductor substrate, employed within semiconductor integrated circuit microelectronics fabrication. The method employs a conformal dielectric oxide layer formed over the topographic substrate layer, where upper lying portions of the conformal dielectric oxide layer corresponding with upper lying features of an underlying topography of the topographic substrate layer are selectively etched prior to a polish planarizing of the etched conformal dielectric oxide layer so formed.

Further, Bose et al., in U.S. Pat. No. 5,492,858, discloses a polish planarizing method for forming a planarized trench isolation region within an isolation trench of high aspect ratio within a semiconductor substrate employed within a semiconductor integrated circuit microelectronics fabrication. The method employs forming a silicon nitride trench liner layer within the isolation trench prior to forming within the isolation trench a conformal oxide dielectric layer which is subsequently steam annealed and polish planarized to form the planarized trench isolation region exhibiting enhanced properties.

Still further, Cooperman et al., in U.S. Pat. No. 5,494,897, discloses a planarizing method for forming a planarized shallow isolation trench region within a topographic semiconductor substrate employed in a semiconductor integrated circuit microelectronics fabrication. The method employs a pair of silicon oxide dielectric layers formed employing a chemical vapor deposition (CVD) method and separated by a layer of silicon where the upper lying silicon oxide dielectric layer and the silicon layer are subsequently chemical mechanical polish (CMP) planarized.

Finally, Gocho et l., in U.S. Pat. No. 5,498,565, discloses a high density plasma chemical vapor deposition (HDP-CVD) method in conjunction with a chemical mechanical polish (CMP) planarizing method for forming a series of patterned planarized trench isolation regions within a series of isolation trenches separated by a series of mesas of varying width within a semiconductor integrated circuit microelectronics fabrication. The method employs a masked isotropic etching of a portion of a comparatively thicker portion of a high density plasma chemical vapor deposited (HDPCVD) dielectric layer formed upon a wider mesa prior to chemical mechanical polish (CMP) planarizing the high density plasma chemical vapor deposited (HDP-CVD) dielectric layer.

Desirable within the art of microelectronics fabrication are additional high density plasma chemical vapor deposition (HDP-CVD) methods employed in conjunction with chemical mechanical polishing (CMP) planarizing methods which may be employed for forming within a topographic substrate layer employed within a microelectronics fabrication with optimal uniformity and planarity a series of patterned planarized aperture fill layers within a series of apertures separated by a series of mesas of varying width. More particularly desirable with the art of semiconductor integrated circuit microelectronics fabrication are additional high density plasma chemical vapor deposition (HDP-CVD) methods employed in conjunction with chemical mechanical polish (CMP) planarizing methods which may be employed for forming within a semiconductor substrate with optimal uniformity and planarity a series of patterned planarized trench isolation regions with a series of isolation trenches separated by a series of mesas of varying width.

It is towards the foregoing goals that the present invention is both generally and more specifically directed.

SUMMARY OF THE INVENTION

A first object of the present invention is to provide a high density plasma chemical vapor deposition (HDP-CVD) method in conjunction with chemical mechanical polish (CMP) planarizing method for forming within a series of apertures within a topographic substrate layer employed within a microelectronics fabrication a series of patterned planarized aperture fill layers.

A second object of the present invention is to provide a method in accord with the first object of the present invention, where the series of patterned planarized aperture fill layers is formed with optimal uniformity and planarity when the series of apertures is separated by a series of mesas of varying width.

A third object of the present invention is to provide a method in accord with the first object of the present invention or the second object of the present invention, where the microelectronics fabrication is a semiconductor integrated circuit microelectronics fabrication, the topographic substrate layer is a semiconductor substrate employed within the semiconductor integrated circuit microelectronics fabrication, the series of apertures is a series of isolation trenches formed within the semiconductor substrate and the series of patterned planarized aperture fill layers is a series of patterned planarized trench isolation regions formed within the series of isolation trenches.

A fourth object of the resent invention is to provide a method in accord with the first object of the present invention, the second object of the present invention or the third object of the present invention, which method is readily commercially implemented.

In accord with the objects of the present invention, there is provided blanket aperture fill layer, and a chemical mechanical polish (CMP) planarizing method for forming a patterned planarized aperture fill layer within a series of apertures within a topographic substrate layer employed within a micorelectronics fabrication. To practice the method of the present invention, there is first provided a topographic substrate layer employed within a microelectronics fabrication. The topographic substrate layer comprises a pair of mesas of substantially equivalent height, where the pair of mesas is separated by an aperture. There is then formed upon the topographic substrate layer a blanket aperture fill layer. The blanket aperture fill layer is formed by employing a simultaneous deposition and sputter method, the blanket aperture fill layer filling the aperture to a planarizing thickness at least as high as the height of the mesas while simultaneously forming a pair of protrusions of the blanket aperture fill layer corresponding with the pair of mesas. The thickness of a protrusion of the blanket aperture fill layer over a narrow mesa is less than the thickness of a protrusion of the blanket fill layer over a wide mesa. There is then removed by blanket etching a portion of the blanket aperture fill layer to form within the aperture a patterned planarized aperture fill layer residue of thickness less than the height of the pair of mesas while simultaneously forming a pair of blanket aperture fill layer protrusion residues upon the pair of mesas. Finally, a chemical mechanical polish (CMP) planarizing is performed of the blanket fill aperture residue layer to form the patterned planarized aperture fill layer between the pair of mesas.

There is provided by the present invention a high density plasma chemical vapor deposition (HDP-CVD) method employed in conjunction with a chemical mechanical polish (CMP) planarizing method for forming within a topographic substrate layer employed within a microelectronics fabrication a series of apertures separated by a series of mesas a series of patterned planarized aperture fill layers, where the series of patterned planarized aperture fill layers is formed with optimal uniformity and planarity. The method of the present invention realizes the foregoing objects by employing within he high density plasma chemical vapor deposition (HDP-CVD) method when forming a blanket planarized aperture fill layer from which is subsequently formed employing a chemical mechanical polish (CMP) planarizing method a series of patterned planarized aperture fill layers a deposition rate sputtering rate ratio which provides a sufficient thickness of the blanket aperture fill layer upon the topographic substrate layer such that after subsequent etching back of a portion of the blanket aperture fill layer, the remaining portion of the blanket aperture fill layer residue is readily and controllably removed by chemical mechanical polish (CMP) planarizing to form the series of patterned planarized aperture fill layers with optimal uniformity and planarity.

The method of the present invention may be employed where the microelectronics fabrication is a semiconductor integrated circuit microelectronics fabrication, the topographic substrate layer is a semiconductor substrate employed within a semiconductor integrated circuit microelectronics fabrication, the series of apertures is a series of isolation trenches formed within the semiconductor substrate and the series of patterned planarized aperture fill layers is a series of patterned planarized trench isolation regions formed within the series of isolation trenches. The method of the present invention does not discriminate with respect to the nature of a microelectronics fabrication within which may be formed a series of patterned planarized aperture fill layers in accord with the method of the present invention. Thus, although the method of the present invention provides substantial value when forming a series of patterned planarized trench isolation within a series of isolation trenches within a semiconductor substrate employed within a semiconductor integrated circuit microelectronics fabrication, the method of the present invention may also be employed in forming a series of patterned planarized aperture fill layers including but not limited to patterned planarized aperture fill conductor layers, patterned planarized aperture fill semiconductor layers and patterned planarized aperture fill dielectric layers within trenches other than isolation trenches within substrates including but not limited to conductor substrates, semiconductor substrates, dielectric substrates and composites thereof employed within microelectronics fabrications including but not limited to semiconductor integrated circuit microelectronics fabrications, solar cell microelectronics fabrications, ceramic substrate microelectronics fabrications and flat panel display microelectronics fabrications.

The method of the present invention is readily commercially implemented. The method of the present invention employs high density plasma chemical vapor deposition (HDP-CVD) methods in conjunction with conventional blanket etch removal procedures and chemical mechanical polish (CMP) planarizing methods as are generally known in the art of microelectronics fabrication. Since it is the process control within the method of the present invention which provides at least in part the method of the present invention, rather than the existence of the microelectronics fabrication methods which provides the present invention, the method of the present invention is readily commercially implemented.

BRIEF DESCRIPTION OF THE DRAWINGS

The objects, features, and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a high-density plasma chemical vapor deposition (HDP-CVD) method in conjunction with chemical mechanical polish (CMP) planarizing method for forming within a microelectronics fabrication a series of patterned planarized aperture fill layers within a series of apertures within a topographic substrate comprising a series of mesas of substantially equivalent heights but differing widths, where the series of patterned planarized aperture fill layers is formed with optimal uniformity and planarity. The present invention realizes the foregoing objects by employing interposed between the high-density plasma chemical vapor deposition (HDP-CVD) method and the chemical mechanical polish (CMP) planarizing method an etch back method which is applied to a blanket fill aperture layer from which is formed the patterned aperture fill layers. The blanket aperture fill layer, which is originally formed employing a high-density plasma chemical vapor deposition (HDP-CVD) method to a thickness at least equal to the height of the mesas, is etched back to a thickness within each aperture less than the height of the mesas. When etched back in such a fashion, a series of blanket aperture fill layer protrusions residues formed upon the mesas may be removed by employing chemical mechanical polish (CMP) planarizing method while providing the series of patterned planarized aperture fill layers of optimal uniformity and planarity.

Although the method of the present invention provides value when forming patterned planarized trench isolation regions within isolation trenches within semiconductor substrates employed within semiconductor integrated circuit microelectronics fabrications, the method the present invention may also be employed within microelectronics fabrications including but not limited to semiconductor integrated circuit microelectronics fabrications, solar cell microelectronics fabrications ceramic substrate microelectronics fabrications, and flat panel display microelectronics fabrications to form therein patterned planarized aperture fill layers including but not limited to patterned planarized aperture fill conductor layers, patterned planarized semiconductor aperture fill layers and patterned planarized aperture fill dielectric layers with similarly optimal uniformity and planarity with topographic substrate layers including but not limited to topographic conductor substrate layers, topographic semiconductor substrate layers, topographic dielectric substrate layers and composites thereof.

FIRST PREFERRED EMBODIMENT

Figure 1:
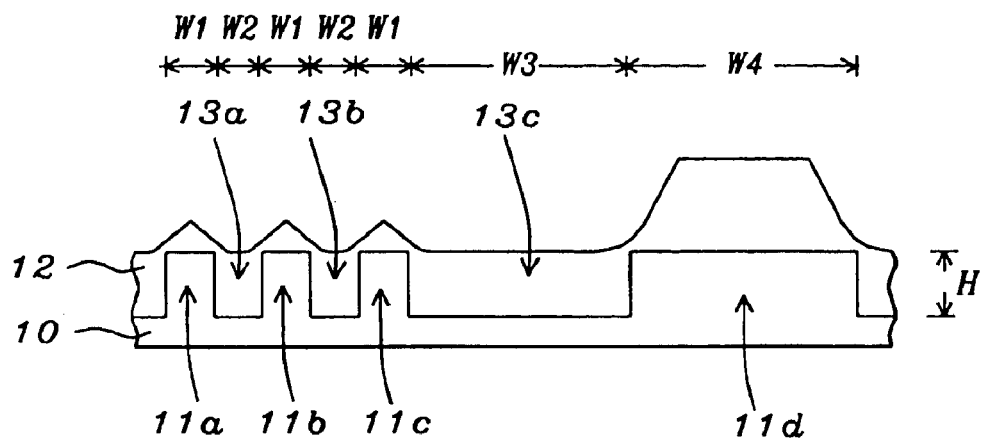
FIG. 1, FIG. 2, FIG. 3, FIG. 4 and FIG. 5 show a series of schematic cross-sectional diagrams illustrating the results of forming in accord with a general embodiment of the method of the present invention which comprises a first preferred embodiment of the present invention a series of patterned planarized aperture fill layers within a series of apertures within a topographic substrate layer within a microelectronics fabrication.

Referring now to FIG. 1, there is shown a series of schematic cross-sectional diagrams illustrating the results of forming within a microelectronics fabrication in accord with a general embodiment of the present invention which comprises a first preferred embodiment of the present invention a series of patterned planarized aperture fill layers within topographic substrate layer defined by a series of mesas of substantially equivalent height but differing widths, where the series of patterned planarized aperture fill layers is formed employing a high density plasma chemical vapor deposition (HDP-CVD) method and a subsequent partial removal by blanket etching back of a portion of the surface of the aperture fill layer, followed by chemical mechanical polish (CMP) planarizing method. Shown in FIG. 1 is a schematic cross-sectional diagram of the microelectronics fabrication at an early stage in its fabrication in accord with the method of the present invention. A topographic substrate layer 10 defined by a series of narrow mesas 11a, 11b and 11c of width W1 having interposed therebetween a pair of narrow apertures 13a and 13b of width W2, where the series of narrow apertures 13a and 13b are separated from a wide mesa 11d of width W4 by a wide aperture 13c of width W3. Within he first preferred embodiment of the method of the present invention, the topographic substrate layer 10 may be employed within a microelectronics fabrication selected from the group including but not limited to semiconductor integrated circuit microelectronics fabrications, solar cell microelectronics fabrications, ceramic substrate microelectronics fabrications, and flat panel microelectronics fabrications. Although not specifically illustrated within the schematic cross-sectional diagram of FIG. 1, the topographic substrate layer 10 may be formed from the substrate alone employed within the microelectronics fabrication, or in the alternative, the topographic substrate layer 10 may be formed employing a composite of a substantially flat substrate employed within the microelectronics fabrication, upon which substantially flat substrate is formed an additional patterned layer to form in the aggregate the topographic substrate layer 10. Within the first preferred embodiment of the method of the present invention, the substrate alone, whether by itself substantially flat or by itself to topographic substrate layer, in conjunction with the patterned layer, may each be formed independently of materials including microelectronics conductor materials, microelectronics semiconductor materials, microelectronics dielectric materials and composites thereof.

Referring still to FIG. 1, within the first preferred embodiment of the present invention the width W1 of each narrow mesa 11a, 11b and 11c within the series of narrow mesas is typically and preferably between about 0.25 and 0.5 microns. Similarly, within the first preferred embodiment of the present invention the width W2 of each narrow aperture 13a or 13b within the pair of narrow apertures is typically and preferably from about 0.25 to about 0.5 microns. Yet similarly, within the first preferred embodiment of the present invention, the width W3 of the wide aperture 3c is typically and preferably wider than about 3 microns. Still yet similarly, within he first preferred embodiment of the present invention, the width W4 of the wide mesa 11d is typically and preferably wider than about 3 microns. Finally, within the first preferred embodiment of the present invention, each of the mesas 11a, 11b and 11c preferably has a substantially equivalent height H, as illustrated in FIG. 1, of from about 5000 to about 7000 angstroms, where the term "substantially" is intended to accommodate localized differences in microelectronics fabrication methods employed when forming the series of mesas 11a, 11b and 11c using conventional photolithographic and chemical processes.

Referring now still to FIG. 1, there is shown a blanket aperture fill layer 12 formed upon the topographic substrate layer 10 while completely covering the series of mesas 11a, 11b, and 11c and simultaneously partially filling the series of apertures 13a, 13b, and 13c Within he fist preferred embodiment of the method of the present invention, the blanket aperture fill layer is formed employing a high density plasma chemical vapor deposition (HDP-CVD) method where a deposition rate sputter rate ratio employed within the (HDP-CVD) method is typically chosen to optimize gap filling of the blanket aperture fill layer 12 to optimize the filling of the topography of the underlying series of mesas and apertures. Typically and preferably, the deposition rate:sputter rate ratio will be from about 8:1 to about 4:1. Within the first preferred embodiment of the method of the present invention, the blanket aperture fill layer 12 is formed to a planarizing thickness at least as the height H of the mesas 11a, 11b, 11c and 11d illustrated in FIG. 1.

Figure 2:
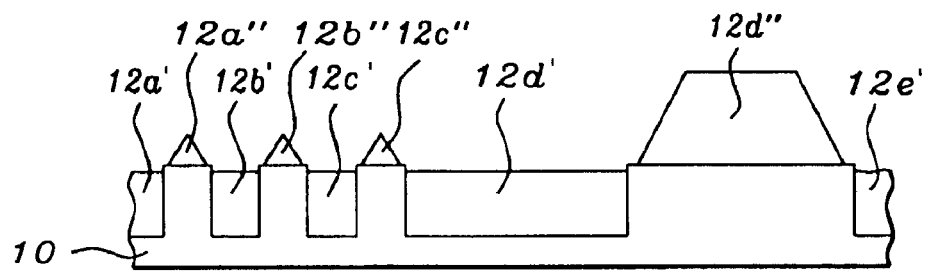

Referring now more particularly to FIG. 2, there is shown a schematic cross-sectional diagram illustrating the results of further processing of the microelectronics fabrication whose schematic cross-sectional diagram is shown in FIG. 1 in accord with the first preferred embodiment of the method of the present invention. Shown in FIG. 2 is a microelectronics fabrication otherwise equivalent to the microelectronics fabrication shown in FIG. 1, but where the blanket aperture fill layer 12 has been etched back such that the thickness of the blanket aperture fill layer 12a', 12b', 12c, 12d' and 12c' within the apertures has been reduced to a thickness less than the height of the mesas H. Thus there is formed a series of patterned planarized aperture fill layers within the apertures and a series of blanket aperture fill residue protrusions 12a", 12b", 12c" and 12d" upon the mesas. Etching back of the blanket aperture fill layer may be isotropic or anisotropic since the high-performance plasma chemical vapor deposition (HDP-CVD) method provides blanket aperture fill layer profile which is flat over apertures and thus remains flat when forming patterned planarized aperture fill layers. Since patterned planarized aperture fill layers are recessed beneath the top of the series of mesas, patterned planarized aperture fill residue layers are more readily removable by chemical mechanical polish (CMP) planarizing. Isotropic or anisotropic etching methods employ appropriate materials and methods conventional in the art of microelectronics fabrication for etching back the particular material from which is formed the blanket aperture fill layer.

The reduction of the protrusion heights 12a", 12b", 12c" and 12d" of the blanket fill layer 12 over the mesas 11a, 11b, 11c and 11d has exposed the edges of the tops of the narrow mesas 11a, 11b and 11c and the wide mesa 11d, while simultaneously lowering the top level of the blanket fill layer in the apertures 12a', 12b ', 12c', 12d' and 12e' by a readily controllable amount.

Figure 3:
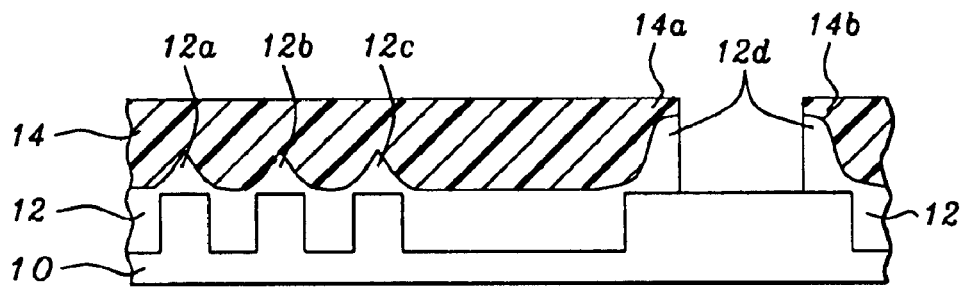

Referring now more particularly to FIG. 3, there is shown a schematic cross-sectional diagram illustrating the results of a further optional processing step in the fabrication of the microelectronics fabrication shown in FIG. 1 in accord with the first preferred embodiment of the method of he present invention. Shown in FIG. 3 is a schematic cross-sectional diagram of a microelectronics fabrication otherwise equivalent to the microelectronics fabrication shown in FIG. 1, but where there has been formed, over the topographic substrate layer 10 containing the series of mesas 11a, 11b, 11c and 11d and apertures 13a, 13b and 13c therein upon which has been deposited the blanket aperture fill layer 12 in accord with the first preferred embodiment of the method of the present invention, a pattern of photosensitive photoresist material 14 by conventional methods employed in the art of microelectronics fabrication, such that the photoresist pattern mask 14a and 14b formed over the substrate has exposed a portion of the blanket aperture fill layer 12 overlying a portion of the top of the wide mesa 11d, allowing the subsequent etch and removal of that portion of the blanket aperture fill layer 12 between the photoresist pattern etching mask portions 12a and 12b. It is desirable to be able to selectively etch away portions of relatively large areas of blanket aperture fill layer 12 while thus protecting from removal those protrusions of the blanket aperture fill layers 12a, 12b, 12c, and 12d as is afforded by this optional portion of the microelectronics fabrication in accord with the first preferred embodiment of the method of the present invention.

Figure 4:
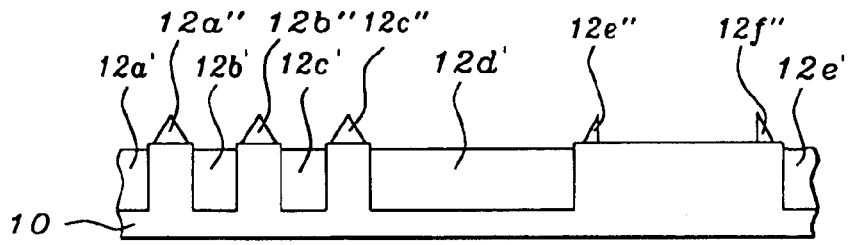

Referring now more particularly to FIG. 4, there is shown a schematic cross-sectional diagram illustrating the results of further processing of the microelectronics fabrication shown in FIG. 2 and optionally in FIG. 3 in accord with the preferred first embodiment of the method of the present invention. Shown in FIG. 4 is a microelectronics fabrication otherwise equivalent to the microelectronics fabrication shown in FIG. 3 but where there has been etched back the blanket aperture fill layer 12 subsequent to the removal of the optional photoresist layer etch mask 14a and 14b, if such was employed, by conventional etching methods employed in the art of microelectronics fabrication. The blanket aperture fill layer residues 12a", 12b", 12c", 12e" and 12f" and the blanket fill aperture layers 12a', 12b', 12c', 12d' and 12e' have been etched back sufficiently, analogous to FIG. 2 of the first preferred embodiment of the present invention, so that the remaining thickness of the blanket aperture fill layer is less than the height of the mesas H.

Figure 5:
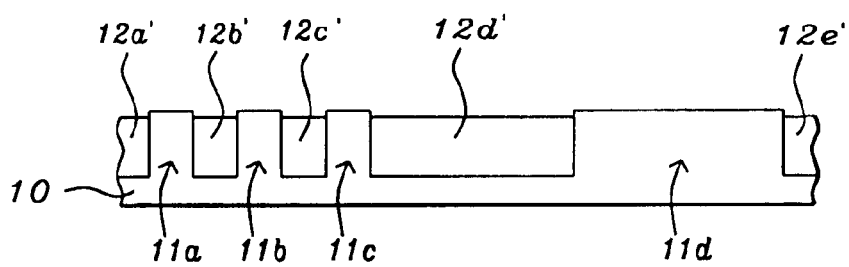

Referring now more particularly to FIG. 5, there is shown a schematic cross-sectional diagram illustrating the final results of further processing of the microelectronics fabrication whose schematic cross-sectional diagram is shown in FIG. 4 in accord with the first preferred embodiment of the present invention. Shown in FIG. 5 is a microelectronics fabrication otherwise equivalent to the microelectronics fabrication shown in FIG. 4, but where there has been formed the series of patterned planarized blanket aperture fill layers 12a', 12b', 12c', 12d' and 12c' within he series of mesas 11a, 11b, 11c and 11d by chemical mechanical polish (CMP) planarizing method after etching back blanket aperture fill residue layers 12a", 12b", 12c", 12d", 12e" and 12f" remaining after etching back blanket aperture fill layer 12. The formation of patterned planarized aperture fill layers 12a', 12b', 12c', 12d' and 12e' is accomplished with optimal uniformity and planarity by chemical mechanical polish (CMP) planarizing method because the amount of blanket aperture fill residue layer 12a", 12b", 12c", 12d" and 12e" remaining after etching back the blanket aperture fill layer 12 is thus attenuated. The chemical mechanical polish (CMP) planarizing methods employed removes the blanket aperture fill layer residues 12a", 12b", 12c", 12d", 12e" and 12f" with greater facility since patterned planarized aperture fill layers 12a', 12b', 12c', 12d ' and 12e' are recessed. Similar facilitation of planarizing cannot be achieved by simply depositing a blanket aperture layer thinner than the height H of the mesas since the kinetics of the growth of the blanket aperture fill layer deposition by high-density plasma chemical vapor deposition (HDP-CVD) are geospecific.

The chemical mechanical polishing (CMP) planarizing methods are conventional in the art of semiconductor integrated circuit microelectronics fabrication, which (CMP) planarizing methods will typically and preferably employ an aqueous silica slurry. Preferably the chemical mechanical polishing (CMP) method will also employ typically: (1) a platen pressure from about 7 to about 10 pounds per square inch (psi); (2) a platen rotation speed of from about 20 to about 60 revolutions per minute (rpm); (3) a head counter-rotation speed of from about 20 to about 60 revolutions per minute (rpm); (4) a silicon substrate temperature of from about 15 to about 40 degrees centigrade; (5) an aqueous silica slurry concentration of about 10 to about 20 weight percent; and (6) an aqueous silica slurry flow of from about 100 to about 300 cubic centimeters per minute (ccm).

SECOND PREFERRED EMBODIMENT

Figure 6:
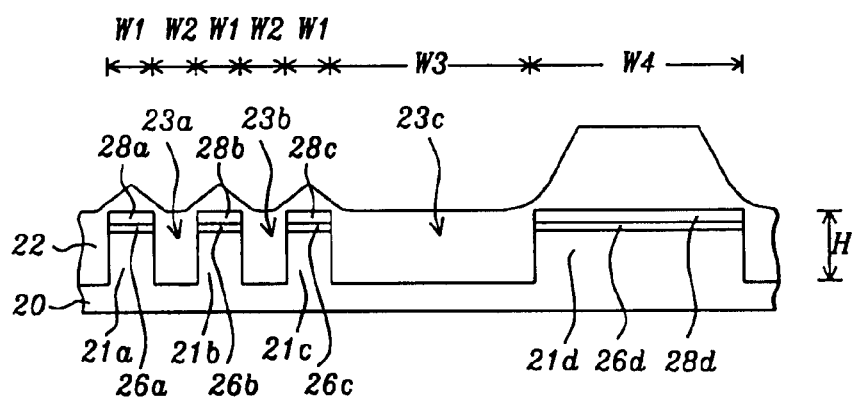
FIG. 6, FIG. 7, FIG. 8, FIG. 9, FIG. 10 and FIG. 11 show a series of schematic cross-sectional diagrams illustrating the results of forming in accord with a more specific embodiment of the present invention which comprises a second preferred embodiment of the present invention a series of trench isolation fill layers within a series of isolation trenches within a semiconductor substrate employed within a semiconductor integrated circuit microelectronics fabrication.

Referring now to FIG. 5 to FIG. 11, there is shown a series of schematic cross-sectional diagrams illustrating the results of forming within a semiconductor integrated circuit microelectronics fabrication in accord with a more specific embodiment of the present invention which comprises a second preferred embodiment of the method of the present invention a series of trench isolation regions within a silicon semiconductor substrate in accord with the method of the present invention. Shown in FIG. 6 is a schematic cross-sectional diagram of the silicon semiconductor integrated microelectronics fabrication at an early stage in its fabrication in accord with the second preferred embodiment of the present invention.

Shown in FIG. 6 is a silicon semiconductor substrate 20 having formed therein a series of narrow mesas 21a, 21b, 21c having interposed therebetween a pair of narrow trenches 23a and 23b, where the series of narrow mesas 21a, 21b and 21c is separated from a wide mesa 21d by a wide trench 23c.

Although it is know in the art of semiconductor integrated circuit microelectronics fabrication that silicon semiconductor substrated are available with either dopant polarity, several dopant concentrations and various crystallographic orientations, for the second preferred embodiment of the present invention, the silicon semiconductor substrate 20 is preferably a (100) silicon semiconductor substrate having an N- or P-type doping.

Also shown within FIG. 6 formed and aligned upon each of the narrow mesas 21a, 21b and 21c is a patterned thermal silicon oxide pad oxide layer 26a, 26b and 26c in turn having formed and aligned thereupon a patterned silicon nitride layer 28a, 28b and 28c. Similarly, there is also shown within FIG. 6 formed and aligned upon the wide mesa 21d patterned thermal silicon oxide pad oxide layer 26d in turn having formed thereupon a patterned silicon nitride layer 28d. Within the second preferred embodiment of the present invention, that patterned thermal silicon oxide pad oxide layers 26a, 26b, 26c and 26d are preferably formed employing a thermal oxidation method where portions of the silicon substrate 20 are oxidized at a temperature of from about 800 to about 900 degrees centigrade to form the patterned thermal silicon oxide layer 26a, 26b, 26c and 26d each of thickness of about 110 angstroms. Similarly, the patterned silicon nitride layers 28a, 28b, 28c and 28d are preferably formed employing a chemical vapor deposition (CVD) method to form the patterned silicon nitride layers 28a, 28b, 28c and 28d each of thickness of from about 1000 to about 2000 angstroms aligned upon the thermal silicon oxide pad oxide layers 26a, 26b, 26c and 26d.

As shown within FIG. 6, each of the patterned silicon nitride layers 28a, 28b and 28c has a width W1 each of the narrow trenches 23a and 23b has a width W2 the patterned silicon nitride layer 28d has a width W4 the wide trench 23c has a width W3 and the series of mesas including the series of patterned silicon nitride layers 28a, 28b, 28c and 28d upon the thermal silicon pad oxide layers 26a, 26b, 26c and 26d each has a height H, where the widths W1 W2 W3 and W4 and the height H are analogous to or equivalent to the widths W1, W2, W3 and W4 and the height H of the corresponding mesas and trenches within the first preferred embodiment of the present invention as illustrated within the schematic cross-sectional diagram of FIG. 1.

There is shown within FIG. 6 a blanket trench fill dielectric layer 22 formed over the silicon semiconductor substrate 20, including the series of patterned silicon oxide pad oxide layers 26a, 26b, 26c and 26d, and the series of patterned silicon nitride layers 28a, 28b, 28c and 28d. Within he second preferred embodiment of the present invention, the blanket trench fill dielectric layer 22 is formed of a silicon oxide dielectric material formed employing a high density plasma chemical vapor deposition (HDP-CVD) method, preferably employing silane as a silicon source material, oxygen as an oxidant source material, and argon as a sputtering source material. Similarly with the blanket aperture fill layer 12 employed within the first preferred embodiment of the present invention, the blanket trench fill layer 22 is formed with a deposition rate:sputter rater ratio which provides optimal gap filling of the blanket trench fill dielectric layer. Similarly with the first preferred embodiment of the present invention, the high density plasma chemical vapor deposition (HDP-CVD) method preferably employs the first deposition rate:sputter rate ratio of from about 4:1 to about 8:1.

Preferably, the high density plasma chemical vapor deposition (HDP-CVD) method also employs when fabricating a 200 millimeter (mm) diameter silicon semiconductor substrate 20: (1) a reactor chamber pressure of from about 9 to about 13 mtorr; (2) a radio frequency source power of from about 2000 to about 5000 watts at a source radio frequency of 2 mHz; (3) a bias sputtering power of from about 2500 to about 3500 watts; (4) a silane silicon source material flow rate of from about 10 to about 20 standard cubic centimeters per minute (sccm); (5) an oxygen oxidant flow rate of from about 30 to about 50 standard cubic centimeters per minute (sccm); an (6) an argon sputtering source material flow rate of from about 10 to about 20 standard cubic centimeters per minute (sccm). Preferably, the blanket trench fill dielectric layer 24 is formed to a thickness of from about 6000 to about 8000 angstroms.

Figure 7:
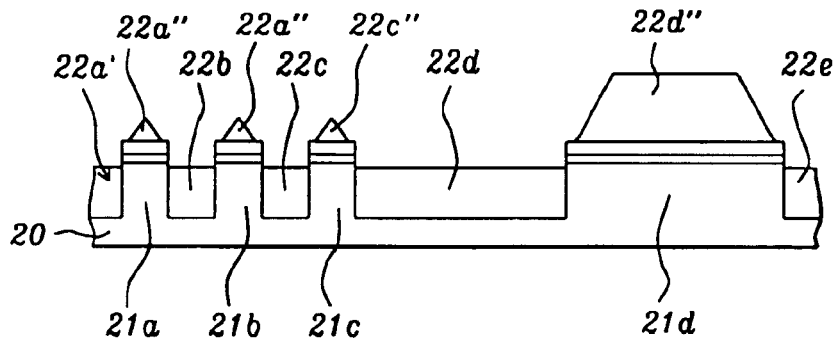

Referring now more particularly to FIG. 7, there is shown a schematic cross-sectional diagram illustrating the results of further processing of the semiconductor integrated circuit microelectronics fabrication whose schematic cross-sectional diagram is illustrated in FIG. 6 in accord with the second preferred embodiment of the present invention. Shown in FIG. 7 is a semiconductor integrated circuit microelectronics fabrication otherwise equivalent to the semiconductor integrated circuit microelectronics fabrication whose schematic cross-sectional diagram is illustrated in FIG. 6, but wherein there has been etched back the blanket fill aperture layer 22 such that the thickness of the blanket aperture fill layer 22a', 22b', 22c', 22d' and 22e' within the apertures has been reduced to a thickness less than the height of the mesas H, and there is formed a series of patterned planarized aperture fill layers within the apertures and a series of blanket aperture fill residue protrusions 22a", 22b", 22c", 22d" and 22e" upon the mesas analogous or equivalent to the series of aperture fill layers and aperture fill residue protrusions shown in FIG. 2 of the first preferred embodiment of the present invention.

Figure 8:
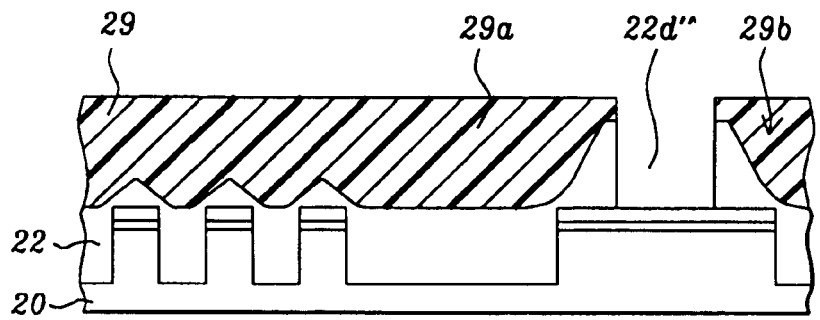

Referring now more particularly to FIG. 8, there is shown a schematic cross-sectional diagram illustrating the results of optional further processing of the integrated circuit microelectronics fabrication whose schematic cross-sectional diagram is shown in FIG. 6 in accord with the preferred second embodiment of the present invention. Shown in FIG. 8 is an integrated circuit microelectronics fabrication otherwise equivalent to the integrated circuit microelectronics fabrication shown in FIG. 6, but where there is shown an optional photosensitive material layer 29 patterned into a photoresist mask 29a and 29b analogous or equivalent to the optional photoresist mask layer 14 shown in FIG. 3 of the first preferred embodiment of the present invention. Aligned over the blanket trench fill layer 22 within the wide trench 23c in the semiconductor substrate 20 is the opening in the photoresist mask 29a and 29b through which the exposed portion 22d" of the blanket trench fill dielectric layer 22 has been removed by etching with conventional methods employed in the art of microelectronics fabrication.

Figure 9:
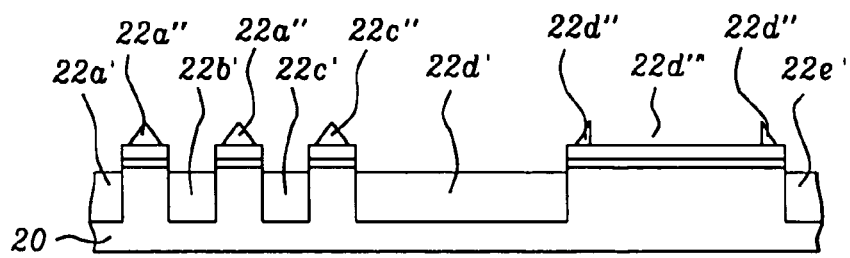

Referring now more particularly to FIG. 9, there is shown a schematic cross-sectional diagram illustrating the results of further processing of the semiconductor integrated circuit microelectronics fabrication whose schematic cross-sectional diagram is illustrated in FIG. 8 in accord with the second preferred embodiment of he present invention. Shown in FIG. 9 is a schematic cross-sectional diagram of a semiconductor integrated circuit microelectronics fabrication otherwise equivalent to the semiconductor integrated circuit microelectronics fabrication whose schematic cross-sectional diagram is shown in FIG. 8, but wherein subsequent subtractive etching of the exposed blanket trench fill dielectric layer 22 through the photoresist mask 29a and 29b has been follows by stripping of the photoresist mask by conventional means follows by partial etching back of a portion of the blanket trench fill dielectric layer 22 to leave the remaining portion of the blanket trench fill dielectric layer residue 22a', 22b', 22c', 22d' and 22e' in the trench regions and protrusions 22a", 22b", 22c" and 22d" analogous to FIG. 7 of the second preferred embodiment of the present invention on top of the silicon nitride layers 28a, 28b, 28c and 28d aligned upon the silicon oxide pad oxide layers 26a, 26b, 26c and 26d on top of the mesas 21a, 21b, 21c and 21d.

Figure 10:
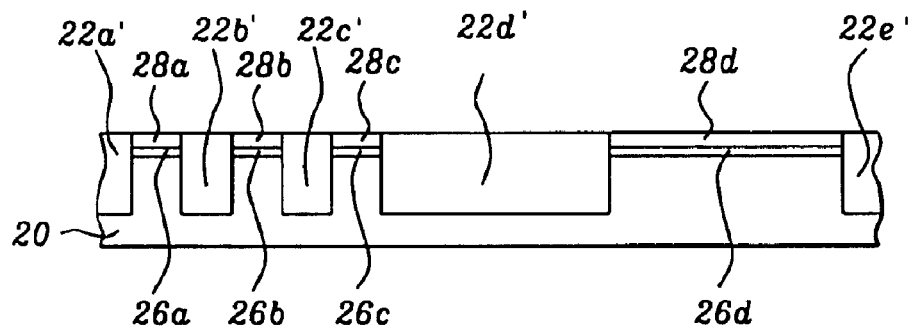

Referring now more particularly to FIG. 10, there is shown a schematic cross-sectional diagram of the results of further processing of the semiconductor integrated circuit microelectronics fabrication whose schematic cross-sectional diagram is shown in FIG. 9 in accord with the second preferred embodiment of the present invention. Shown in FIG. 10 is a schematic cross-sectional diagram of a semiconductor integrated circuit fabrication otherwise equivalent to the semiconductor integrated circuit microelectronics fabrication shown in FIG. 8 or FIG. 9 but wherein the blanket trench fill dielectric layer residues 22a', 22b', 22c', 22d' and 22c' and protrusions 22a", 22b", 22c" and 22d" have been chemical mechanical polish (CMP) planarized to form the patterned planarized series of trench fill dielectric layers between the mesas.

The chemical mechanical polish (CMP) planarizing method employed in the second preferred embodiment of the present invention is conventional similar to the method employed as described in the first preferred embodiment of he present invention.

Figure 11:
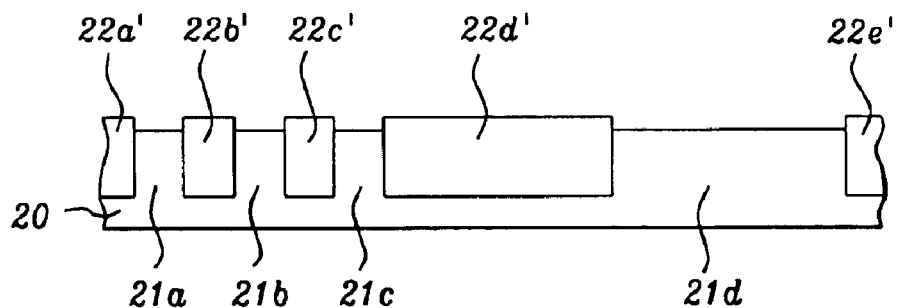

Referring now more particularly to FIG. 11, there is shown a schematic cross-sectional diagram illustrating the results of further processing of a semiconductor integrated circuit fabrication whose schematic cross-sectional diagram is shown in FIG. 10 in accord with the second preferred embodiment of the present invention. Shown in FIG. 11 is a schematic cross-sectional diagram of a semiconductor integrated circuit microelectronics fabrication otherwise equivalent to the semiconductor integrated circuit microelectronics fabrication whose schematic cross-sectional diagram is shown in FIG. 10, but wherein subsequent subtractive etching has removed the patterned silicon nitride layers 28a, 28b, 28c and 28d and the underlying patterned silicon oxide pad oxide layers 26a, 26b, 26c and 26d from the tops of the mesas 21a, 21b, 21c and 21d.

As is understood by a person skilled in the art, the patterned silicon nitride layers 28a, 28b, 28c and 28d are typically and preferably removed by etching methods as are conventional in the art of semiconductor integrated circuit microelectronics fabrication, which etch methods will typically include wet chemical etch methods employing refluxing phosphoric acid. As is similarly understood by a person skilled in the art, patterned thermal silicon oxide pad oxide layers 26a, 26b, 26c and 26d are typically and preferably removed by etch methods which are conventional in the art of microelectronics fabrication, which etch methods will typically, but not exclusively, include wet chemical etch methods employing aqueous hydrofluoric acid solutions.

As is understood by a person skilled in the art, although not specifically illustrated within the schematic cross-sectional diagrams of FIG. 1 through FIG 11, there may be employed within the preferred embodiments of the present invention various conventional methods in addition to those illustrative of the present invention, which is not meant to be limiting. Revisions and modifications may be made to methods, materials, structures, and dimensions through which is formed a microelectronics fabrication or a semiconductor integrated circuit microelectronics fabrication in accord with the first preferred embodiment of the present invention, while still providing a microelectronics fabrication or a semiconductor integrated circuit microelectronics fabrication formed in accord with the present invention, as defined by the appended claims.

What is claimed is:

1. A method, comprising:
    forming a topographic portion having in an upper side thereof an aperture configuration which includes at least one aperture, and which defines first and second mesas that are part of the topographic portion and that project upwardly to approximately the same height the second mesa being wider than the first mesa;
    forming over the topographic portion a fill layer that fills each aperture to a height at least as high as the tops of the first and second mesas;
    selectively etching the fill layer at a location disposed above the second mesa to remove a portion of the material of the fill layer disposed over the second mesa;
    thereafter etching the fill layer above the aperture configuration and above the first and second mesas, the first and second mesas each being left with a residue portion of the fill layer thereon; and
    planarizing the fill layer in a manner which removes from each of the mesas the residue portion of the fill layer, and which planarizes the material of the fill layer within each aperture.

2. The method of claim 1, wherein etching of the fill layer above the aperture configuration and the mesas is carried out until a portion of the fill layer disposed within each aperture has a top surface lower than the top surfaces of the mesas.

3. The method of claim 1, wherein the first mesa has a width greater than about 3 microns, and the second mesa has a width less that about 0.25 to 0.5 microns.

4. The method of claim 1, wherein the selectively etching includes:
    forming a patterned photoresist layer over the fill layer;
    thereafter etching the fill layer using the photoresist layer as an etch mask; and
    removing the photoresist layer.

5. The method of claim 1, wherein the planarizing includes use of a chemical mechanical polishing (CMP) technique.

6. The method of claim 1,
    wherein the forming of the topographic portion is carried out so that the topographic portion is part of a semiconductor substrate, and so that the aperture configuration includes a plurality of apertures which are each an isolation trench provided in the material of the semiconductor substrate; and
    wherein the forming of the fill layer includes selecting as the fill layer a material that serves as an isolation region within each of the isolation trenches.

7. The method of claim 1,
    wherein the forming of the topographic portion includes configuring the topographic portion to be part of a microelectronics fabrication, and to have the aperture configuration thereof include a patterned series of mesas that are of substantially equivalent height but differing widths and that are separated by a patterned series of apertures, the series of apertures including the at least one aperture, and the series of mesas including the first and second mesas, with the first and second mesas respectively having a first width of about 0.25 to 0.5 microns and a second width of greater than about 3 microns;
    wherein the forming of the fill layer includes using a simultaneous deposition and sputter method to form the fill layer as a blanket fill layer that fills the patterned series of apertures, the height of the fill layer being at least as high as the height of each of the mesas in the series of mesas, and the fill layer having a series of protrusions that correspond to the patterned series of mesas and that include first and second protrusions respectively disposed over the first and second mesas, the thickness of the first protrusion being less than the thickness of the second protrusion;
    wherein the selective etching of the fill layer includes forming over the fill layer a patterned photoresist layer that leaves exposed a portion of the fill layer disposed over the second mesa, and includes using the patterned photoresist layer as an etch mask during the selective etching so that the selective etching exposes a surface on the second mesa;
    wherein the etching of the fill layer above the aperture configuration and the mesas includes forming within the patterned series of apertures a series of patterned planarized aperture fill layers with a thickness less than the height of the mesas, while simultaneously forming a series of patterned aperture fill residue layers on the patterned series of mesas, the aperture fill residue layers including the residue portions on the first and second mesas; and
    wherein the planarizing includes chemical mechanical polish (CMP) planarizing of the series of patterned aperture fill residue layers to form a series of patterned planarized aperture fill layers with optimal uniformity and planarity.

8. The method of claim 7, including selecting a dielectric material for use as the fill layer.

9. The method of claim 7 wherein the microelectronics fabrication is selected from the group consisting of semiconductor integrated circuit microelectronics fabrications, solar cell microelectronics fabrications, ceramic substrate microelectronics fabrications, and flat panel display microelectronics fabrications.

10. The method of claim 7 wherein the topographic portion is selected from the group consisting of topographic conductor substrate layers, topographic semiconductor substrate layers, topographic insulator substrate layers and composites thereof.

11. The method of claim 7 wherein the fill layer is formed from an aperture fill material selected from the group consisting of conductor aperture fill materials, semiconductor aperture fill materials, and insulator aperture fill materials.

12. The method of claim 8 wherein the microelectronics fabrication is selected from the group consisting of semiconductor integrated circuit microelectronics fabrications, solar cell microelectronics fabrications, ceramic substrate microelectronics fabrications, and flat panel display microelectronics fabrications.

13. The method of claim 8 wherein the topographic portion is selected from the group consisting of topographic conductor substrate layers, topographic semiconductor substrate layers, topographic insulator substrate layers and composites thereof.

14. The method of claim 8 wherein:

the topographic portion is a topographic semiconductor substrate;

the series of apertures is a series of isolation trenches within the semiconductor substrate; and the series of patterned planarized aperture fill layers is a series of isolation regions formed within the series of isolation trenches.

* * * * *